(12) United States Patent
Lee et al.

(10) Patent No.: US 9,520,423 B2
(45) Date of Patent: Dec. 13, 2016

(54) IMAGE SENSORS INCLUDING NON-ALIGNED GRID PATTERNS

(71) Applicant: Samsung Electronics Co., Ltd., Suwon-si (KR)

(72) Inventors: Yun Ki Lee, Seoul (KR); Joonkyoung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/966,587

(22) Filed: Dec. 11, 2015

(65) Prior Publication Data
US 2016/0172394 A1 Jun. 16, 2016

(30) Foreign Application Priority Data

Dec. 11, 2014 (KR) .................. 10-2014-0178618

(51) Int. Cl.
*H01L 27/00* (2006.01)
*H01L 27/146* (2006.01)

(52) U.S. Cl.
CPC ..... *H01L 27/14605* (2013.01); *H01L 27/1463* (2013.01); *H01L 27/14607* (2013.01); *H01L 27/14621* (2013.01); *H01L 27/14627* (2013.01); *H01L 27/14634* (2013.01); *H01L 27/14636* (2013.01); *H01L 27/14645* (2013.01)

(58) Field of Classification Search
CPC .............. H01L 27/14605; H01L 27/14621; H01L 27/14627; H01L 27/1463; H01L 27/14636; H01L 27/14645
See application file for complete search history.

(56) References Cited

U.S. PATENT DOCUMENTS

| | | | |
|---|---|---|---|
| 8,610,228 B2 | 12/2013 | Saitou et al. | |
| 8,614,470 B2 | 12/2013 | Lee et al. | |
| 8,692,304 B2 | 4/2014 | Huang et al. | |
| 8,835,981 B2 | 9/2014 | Oishi | |
| 8,916,917 B2 | 12/2014 | Furuya et al. | |
| 2009/0090850 A1 | 4/2009 | Liu et al. | |
| 2010/0091161 A1* | 4/2010 | Suzuki .............. | H01L 27/14609 348/302 |
| 2010/0155868 A1 | 6/2010 | Jang | |
| 2010/0214454 A1* | 8/2010 | Kikuchi .............. | G02B 3/0068 348/272 |
| 2011/0242376 A1 | 10/2011 | Ando | |

FOREIGN PATENT DOCUMENTS

| | | |
|---|---|---|
| JP | 2014-003116 | 1/2014 |
| KR | 10-0729745 | 6/2007 |
| KR | 1020100077564 A | 7/2010 |
| KR | 10-2011-0000891 A | 1/2011 |
| KR | 1020110079326 A | 7/2011 |

* cited by examiner

*Primary Examiner* — Whitney T Moore
*Assistant Examiner* — Joseph Galvin, III
(74) *Attorney, Agent, or Firm* — Myers Bigel, P.A.

(57) ABSTRACT

An image sensor includes a substrate including a first surface and a second surface, a first device isolation layer disposed in the substrate and defining a plurality of pixels in the substrate, and having a lower surface adjacent the first surface of the substrate and an upper surface adjacent the second surface of the substrate. Each of the pixels includes a photoelectric conversion element, a floating diffusion region adjacent the first surface of the substrate, and a grid pattern on the second surface of the substrate. At least one of the grid patterns is not vertically aligned with the first device isolation layer.

20 Claims, 13 Drawing Sheets

4000

5000

IMAGE SENSORS INCLUDING NON-ALIGNED GRID PATTERNS

CROSS-REFERENCE TO RELATED APPLICATION

This U.S. non-provisional patent application claims priority under 35 U.S.C. §119 to Korean Patent Application No. 10-2014-0178618, filed on Dec. 11, 2014, in the Korean Intellectual Property Office, the disclosure of which is hereby incorporated by reference in its entirety.

BACKGROUND

The inventive concepts relate to image sensors. More particularly, the inventive concepts relate to image sensors with improved sensitivity.

An image sensor is a semiconductor device that converts an optical image into electrical signals. Image sensors include charge coupled device (CCD) type image sensors and complementary metal-oxide-semiconductor (CMOS) image sensors.

As semiconductor devices become more highly integrated, the size of pixels of image sensors has been reduced. Although decreasing the pixel size may increase the number of pixels that can be formed in a given area, the increasing density of pixels may cause an increase in crosstalk between pixels in an image sensor, and the sensitivity of the image sensor may be reduced.

SUMMARY

Embodiments of the inventive concepts may provide image sensors capable of improving sensitivity.

In an aspect, an image sensor may include: a substrate including a first surface and a second surface; a first device isolation layer disposed in the substrate to define pixels, the first device isolation layer having one surface exposed by the first surface and another surface exposed by the second surface; a photoelectric conversion element disposed in the substrate of each of the pixels; a floating diffusion region disposed in the substrate of each of the pixels and exposed by the first surface of the substrate; and a grid pattern disposed on the second surface of the substrate of each of the pixels. At least one of the grid patterns may not be vertically aligned with the first device isolation layer.

In an embodiment, the one surface and the another surface of the first device isolation layer may be opposite to each other.

In an embodiment, the grid pattern may vertically overlap with a partial region of the photoelectric conversion element which is adjacent to the first device isolation layer.

In an embodiment, the image sensor may further include: an interconnection structure disposed on the first surface of the substrate; a color filter disposed on the second surface of the substrate to correspond to the photoelectric conversion element of each of the pixels; and a micro-lens disposed on the color filter.

In an embodiment, the pixels may include a first pixel and a second pixel, and the color filter may be disposed between the grid pattern of the first pixel and the grid pattern of the second pixel to cover the photoelectric conversion element of the first pixel and a partial region of the photoelectric conversion element of the second pixel at the same time.

In an embodiment, the micro-lens may include a first point and a second point at which a top surface and a bottom surface of the micro-lens meet each other. The first point may be adjacent to one sidewall of the color filter and the second point may be adjacent to another sidewall of the color filter.

In an embodiment, the micro-lens may include a first point and a second point at which a top surface and a bottom surface of the micro-lens meet each other. The first point may be disposed on a top surface of the color filter disposed in the first pixel and the second point may be disposed on a top surface of the color filter disposed in the second pixel.

In an embodiment, the pixels may include a first pixel and a second pixel, and the color filter may cover a top surface of the grid pattern disposed in each of the pixels. In this case, the image sensor may further include: an isolation part disposed between the color filter of the first pixel and the color filter of the second pixel.

In an embodiment, a shortest distance between a center of the grid pattern and the second surface of the substrate may be smaller than a shortest distance between the center of the grid pattern and the another surface of the first device isolation layer.

In an embodiment, the substrate may include: a central region; a first edge region surrounding a first side of the central region and a third side of the central region adjacent to the first side; and a second edge region surrounding a second side of the central region and a fourth side of the central region adjacent to the second side. The pixels may include: a first pixel disposed in the first edge region; a second pixel disposed in the central region; and a third pixel disposed in the second edge region. The grid pattern disposed in the first pixel may not be vertically aligned with the first device isolation layer.

An image sensor according to further embodiments includes a substrate, first and second pixels in the substrate, a device isolation layer between the first and second pixels, first and second color filters on the substrate above the first and second pixels, respectively; and a grid pattern on the substrate between the first and second color filters. The grid pattern is not vertically aligned with the device isolation layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
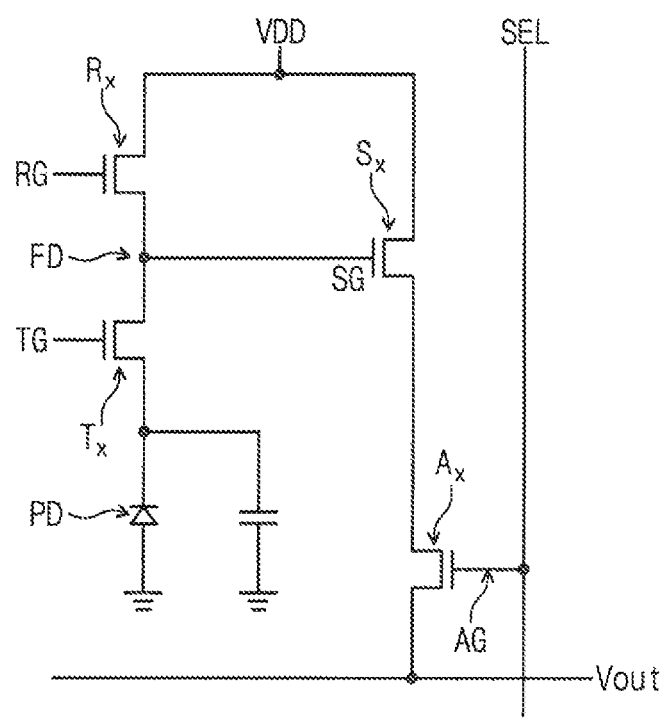
FIG. 1 is a circuit diagram illustrating an image sensor according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that references herein to "an element A not vertically overlapping an element B" (or similar language) means that no vertical line exists that intersects both the elements A and B.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
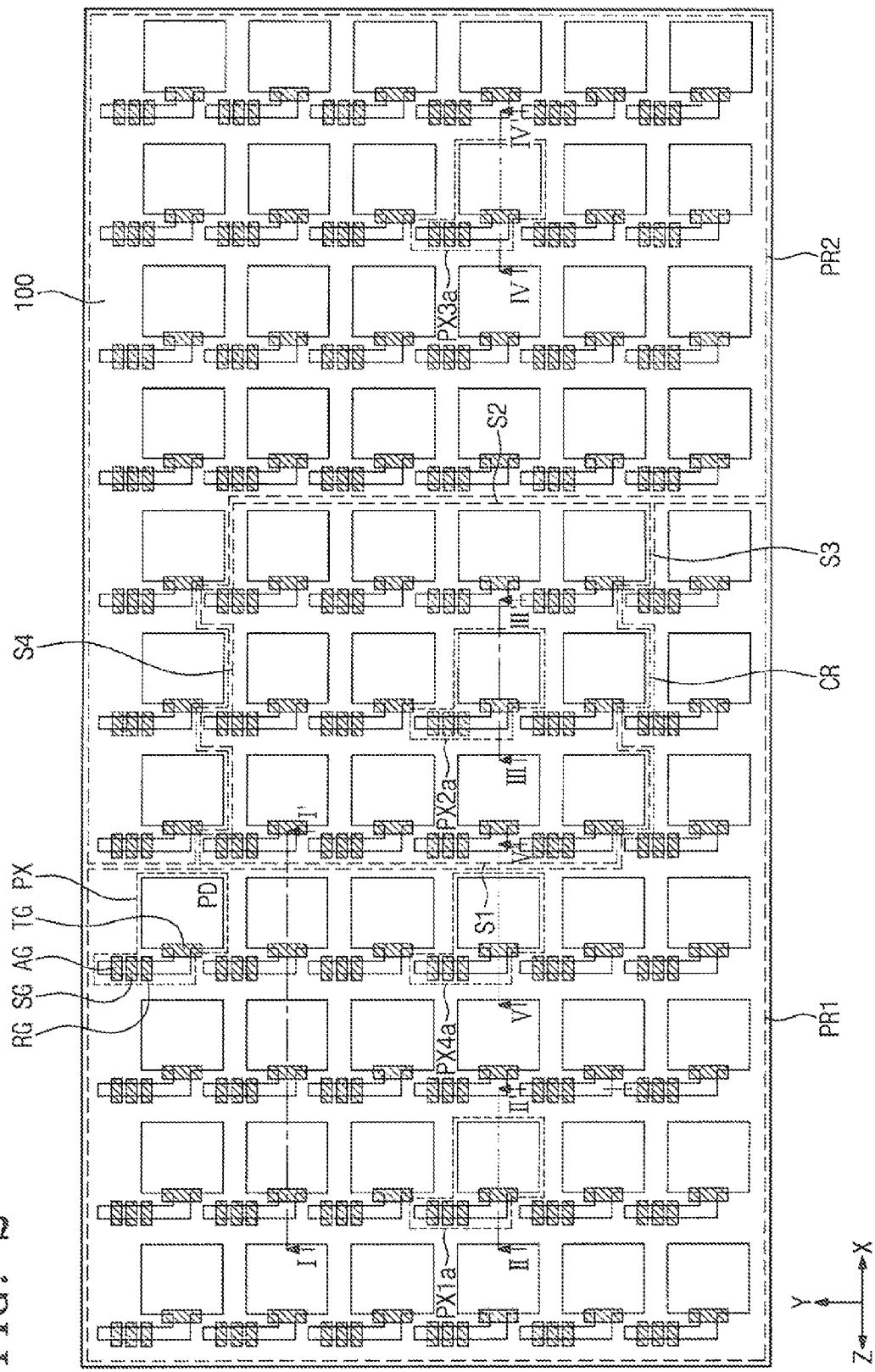
FIG. 2 is a plan view illustrating an image sensor according to some embodiments of the inventive concepts.

FIG. 1 is a circuit diagram illustrating an image sensor according to some embodiments of the inventive concepts. FIG. 2 is a plan view illustrating an image sensor according to some embodiments of the inventive concepts.

Referring to FIGS. 1 and 2, each pixel of an image sensor may include a photoelectric conversion element PD, a transfer transistor $T_X$, a source follower transistor $S_X$, a reset transistor $R_X$, and a selection transistor $A_X$. The transfer transistor $T_X$, the source follower transistor $S_X$, the reset transistor $R_X$, and the selection transistor $A_X$ may include a transfer gate TG, a source follower gate SG, a reset gate RG, and a selection gate AG, respectively. The photoelectric conversion element PD may be a photodiode including an N-type dopant region and a P-type dopant region. A drain of the transfer transistor $T_X$ may be coupled to a floating diffusion region FD. The floating diffusion region FD may also be coupled to a source of the reset transistor $R_X$. The floating diffusion region FD may be electrically connected to the source follower gate SG of the source follower transistor $S_X$. The source follower transistor $S_X$ may be connected to the selection transistor $A_X$. The reset transistor $R_X$, the source follower transistor $S_X$, and the selection transistor $A_X$ may be shared by adjacent pixels, which may increase an integration density of the image sensor.

A method of operating the image sensor will be described with reference to FIG. 1. First, in a dark state, a power voltage VDD may be applied to a drain of the reset transistor $R_X$ and a drain of the source follower transistor $S_X$ and the reset transistor $R_X$ may be turned-on, so charges remaining in the floating diffusion region FD may be discharged through the VDD terminal. Thereafter, the reset transistor RX may be turned-off by applying an appropriate voltage to the reset gate RG. And light may be applied to the photoelectric conversion element PD, which causes electron-hole pairs to be generated in a p-n junction of the photoelectric conversion element PD. A built-in electric field in the p-n junction of the photoelectric conversion element PD causes the generated holes to move into and then accumulate in the P-type dopant region of the photoelectric conversion element PD, and causes generated electrons to move into and accumulate in the N-type dopant region of the photoelectric conversion element PD. The transfer transistor $T_X$ may be turned-on by applying an appropriate voltage to the transfer gate TG to transfer charges (e.g., elements) into the floating diffusion region FD. The transferred charges may accumulate in the floating diffusion region FD. A gate bias of the source follower transistor $S_X$ may change in proportion to the amount of accumulated charges in the floating diffusion region FD, which causes variation in a source potential of the source follower transistor $S_X$. At this time, if the selection transistor $A_X$ is turned-on, a signal generated by the charges may be sensed through a column line Vout.

Figure 3:
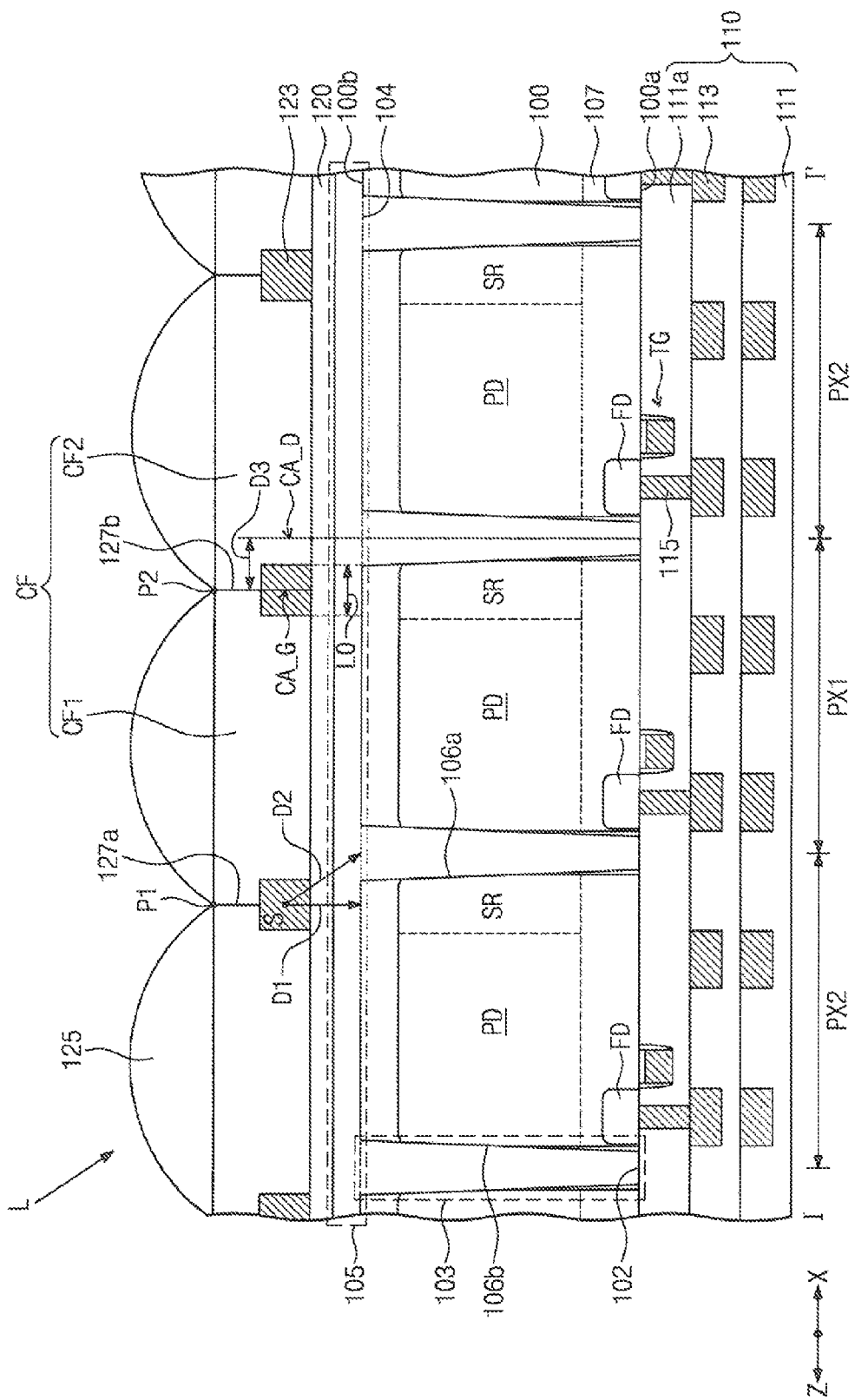
FIG. 3 is a cross-sectional view taken along a line I-I' of FIG. 1 to illustrate an image sensor according to some embodiments of the inventive concepts.
Figure 4:
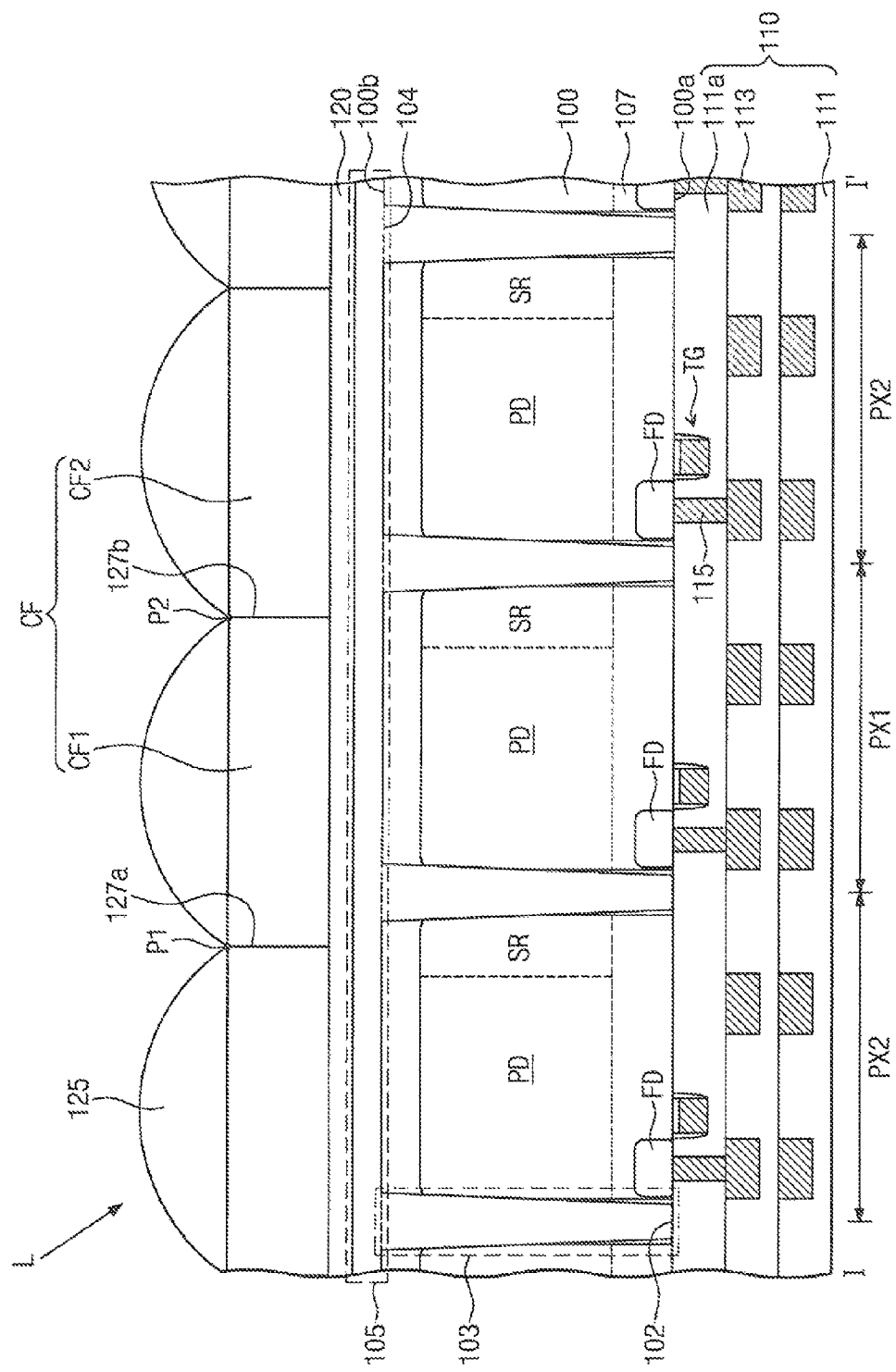
FIG. 4 is a cross-sectional view taken along a line I-I' of FIG. 1 to illustrate an image sensor according to some embodiments of the inventive concepts.

FIG. 2 is a plan view illustrating an image sensor according to some embodiments of the inventive concepts. FIG. 3 is a cross-sectional view taken along a line I-I' of FIG. 1 and illustrates an image sensor according to some embodiments of the inventive concepts. FIG. 4 is a cross-sectional view taken along a line I-I' of FIG. 1 and illustrates an image sensor according to some embodiments of the inventive concepts.

Referring to FIGS. 2 and 3, a substrate 100 may include a first surface 100a and a second surface 100b. For example, the first surface 100a may be a front side of the substrate 100, and the second surface 100b may be a back side of the substrate 100. For example, the substrate 100 may be a semiconductor substrate (e.g., a silicon substrate, a germanium substrate, a silicon-germanium substrate, a II-VI group compound semiconductor substrate, or a III-V group compound semiconductor substrate) or a silicon-on-insulator (SOI) substrate.

The substrate 100 may include a plurality of pixels PX. The pixels PX may include a first pixel PX1 and a second pixel PX2. The first pixel PX1 and the second pixel PX2 may be arranged in an alternating and repeating fashion in a first direction X on the substrate 100. The pixels PX may be defined by a deep device isolation layer DTI formed in the substrate 100. The deep device isolation layer DTI may be formed using a deep trench isolation technique. The deep device isolation layer DTI may include a first device isolation layer 103. The first device isolation layer 103 may include, for example, SiOC, $SiO_2$, poly silicon, SiOCN. In some embodiments, the first device isolation layer 103 may include a cavity therein. A negative fixed charge layer 105 may be formed on and may contact the first device isolation layer 103. The negative fixed charge layer 105 may reduce leakage current by inducing a hole accumulation layer on the substrate 100. For example, the negative fixed charge layer 105 may include aluminium oxide (e.g., $Al_2O_3$), tantalum oxide (e.g., $Ta_2O_5$) or hafnium oxide (e.g., $HfO_2$).

The first device isolation layer 103 may penetrate the substrate 100. The first device isolation layer 103 may include a lower surface 102 and an upper surface 104 that may be opposite to each other. The lower surface 102 of the first device isolation layer 103 may be disposed at the same level as the first surface 100a of the substrate 100, and the upper surface 104 of the first device isolation layer 103 may be disposed at the same level as the second surface 100b of the substrate 100. In some embodiments, the first device isolation layer 103 may extend for only a portion of the substrate 100 in a vertical direction. The upper surface 104 of the first device isolation layer 103 may be disposed at the same level as the second surface 100b of the substrate 100 but the lower surface 102 of the first device isolation layer 103 may be disposed at a higher level than the first surface 100a of the substrate 100 such that the lower surface 102 of the first device isolation layer 103 may not contact the first surface 100a of the substrate 100. The negative fixed charge layer 105 may be formed over and may cover the second surface 100b of the substrate 100. Although FIG. 3 shows an interface between the first device isolation layer 103 and the negative fixed charge layer 105, in some embodiments, the interface may be not invisible. In some embodiments, the first device isolation layer 103 and the negative fixed charge layer 105 may have a unitary structure.

A photoelectric conversion element PD may be disposed in the substrate 100 of each of the pixels PX. The photoelectric conversion element PD may be spaced away from the first surface 100a of the substrate 100. For example, the photoelectric conversion element PD may include a region doped with N-type dopants. A well region 107 may be disposed in the substrate 100 of each of the pixels PX. The well region 107 may be near or adjacent to the first surface 100a of the substrate 100. The well region 107 may be a region doped with P-type dopants, so that a p-n junction is formed between the photoelectric conversion element PD and the well region 107.

A floating diffusion region FD may be disposed in the substrate 100 (e.g., the well region 107) of each of the pixels PX. The floating diffusion region FD may be near or adjacent to the first surface 100a of the substrate 100. The floating diffusion region FD may be a region doped with dopants of which a conductivity type is opposite to that of the dopants of the well region 107. The floating diffusion region FD may be, for example, a region doped with N-type dopants. A transfer gate TG may be disposed on the first surface 100a of the substrate 100. The transfer gate TG may be disposed in each of the pixels PX. The transfer gate TG may be adjacent to the floating diffusion region FD.

An interconnection structure 110 may be disposed on the first surface 100a of the substrate 100. The interconnection structure 110 may include a plurality of interlayer insulating layers 11 and interconnections 113. A first interlayer insulating layer 11a that is in contact with the first surface 100a of the substrate 100 may cover the transfer gate TG. A plurality of through-vias 115 may penetrate the first interlayer insulating layer 111a on the first surface 100a of the substrate 100. Each through-via 115 may be in contact with one of the floating diffusion regions FD.

An anti-reflection layer 120 may be formed over the negative fixed charge layer 105 and may be disposed on the second surface 100b of the substrate 100. The anti-reflection layer 120 may completely cover the negative fixed charge layer 105. The anti-reflection layer 120 may reduce or prevent the reflection of light, such that the light incident on the second surface 100b of the substrate 100 can efficiently reach the photoelectric conversion element PD. The negative fixed charge layer 105 may also have an anti-reflection effect. Although FIG. 3 illustrates that the anti-reflection layer 120 is a single layer, in some embodiments, the anti-reflection layer 120 may include more than two layers. For example, the anti-reflection layer 120 may include $Al_2O_3$ and/or $Ta_2O$. In some embodiments, the negative fixed charge layer 105 may include $Al_2O_3$ and/or $Ta_2O$.

A grid pattern 123 may be disposed on the anti-reflection layer 120. In more detail, the grid pattern 123 may generally be disposed on the second surface 100b of the substrate 100 of each of the pixels PX, with the negative fixed charge layer 105 and the anti-reflection layer 120 between the grid pattern 123 and the second surface 100b of the substrate 100.

The grid patterns 123 may be formed of a reflective material in some embodiments. In some embodiments, an interface between the grid patterns and the color filters CF (discussed below) may be a reflective interface. The grid pattern 123 may include a conductive material (e.g., aluminum(Al), copper(Cu), or silver(Ag)). The grid pattern 123 may not be vertically aligned with the first device isolation layer 103. The grid pattern 123 may vertically overlap with a partial region SR of the photoelectric conversion element PD. The partial region SR may be a portion of the photoelectric conversion element PD. Thus, the partial region SR may include a region doped with N-type dopants. The partial region SR of the photoelectric conversion element PD may be adjacent to the first device isolation layer 103 and may be disposed far away from the floating diffusion region FD. That is, the partial region SR may be disposed near a first vertical sidewall 106a of the photoelectric conversion element PD, while the floating diffusion region FD may be positioned nearer to a second vertical sidewall 106b of the photoelectric conversion element PD that is opposite the first vertical sidewall 106a. The shortest distance D1 between a center S of the grid pattern 123 and the second surface 100b of the substrate 100 may be smaller than the shortest distance D2 between the center S of the grid pattern 123 and the a midpoint of the upper surface 104 of the first device isolation layer 103. The grid pattern 123 may guide light L that is incident obliquely on the second surface 100b of the substrate 100 to a corresponding pixel PX. In other words, the obliquely incident light L may be reflected by the grid pattern 123 into the photoelectric conversion element PD of the corresponding pixel PX.

In some embodiments, a central vertical axis CA_G of the grid pattern 123 may be offset in a third direction Z that is opposite to the first direction X from a central vertical axis CA_D of the device isolation layer 103 by a distance D3 as illustrated in FIG. 3. The central vertical axis CA_G of the grid pattern 123 may pass through the center S of the grid pattern 123, and the central vertical axis CA_D of the device isolation layer 103 may pass through the midpoint of the upper surface 104 of the first device isolation layer 103. Further, the central vertical axis CA_G of the grid pattern 123 may be offset in the third direction Z from the central vertical axis CA_D of the device isolation layer 103 toward the photoelectric conversion element PD. Referring again to FIG. 2, the central vertical axis CA_G of the grid pattern 123 may be offset in the third direction Z from the central vertical axis CA_D of the device isolation layer 103 toward one of opposing short sides of the image sensor that is closer to the pixel PX1. The grid pattern 123 may vertically overlap the photoelectric conversion element PD by a length L0 as illustrated in FIG. 3.

According to FIG. 4, the grid pattern 123 may be omitted. In this case, the obliquely incident light L may be reflected by the deep device isolation layer DTI (e.g., the first device isolation layer 103) into the corresponding pixel PX. Thus, the deep device isolation layer DTI may include a material having an index of refraction less than an index of refraction of the substrate. For example, the deep device isolation layer DTI may be formed of a silicon oxide layer.

Referring again to FIGS. 2 and 3, color filters CF may be disposed on the anti-reflection layer 120. The color filters CF may include a first color filter CF1 and a second color filter CF2. The first color filter CF1 and the second color filter CF2 may be alternately and repeatedly arranged in the first direction X. Each of the color filters CF may be disposed between the grid patterns 123 adjacent to each other. In detail, the first color filters CF1 may be disposed on the photoelectric conversion elements PD of the first pixels PX1 in one-to-one correspondence. The second color filters CF2 may be disposed on the photoelectric conversion elements PD of the first pixels PX2 in one-to-one correspondence. In more detail, the first color filter CF1 may cover the photoelectric conversion element PD of the first pixel PX1 and the partial region SR of the photoelectric conversion element PD of the second pixel PX2 adjacent to the first pixel PX1 at the same time. The second color filter CF2 may cover the photoelectric conversion element PD of the second pixel PX2 and the partial region SR of the photoelectric conversion element PD of the first pixel PX1 adjacent to the second pixel PX2 at the same time.

Micro-lenses 125 may be disposed on the color filters CF. The micro-lenses 125 may be disposed on the color filters CF in one-to-one correspondence. In detail, each of the micro-lenses 125 may have a convex top surface. The micro-lens 125 may include a first point P1 and a second point P2 at which the top surface and a bottom surface of the micro-lens 125 meet each other. The first point P1 may fall on one sidewall 127a of the color filter CF, and the second point P2 may fall on another sidewall 127b of the color filter CF. The micro-lens 125 may have the same width as the color filter CF.

Referring again to FIG. 3, if the grid pattern 123 is vertically aligned with the deep device isolation layer DTI, oblique light which may not be reflected by the grid pattern but may pass through a first color filter may be provided into a photoelectric conversion element of a neighboring pixel sensing a second color. Thus, crosstalk may occur between adjacent pixels. In other words, the sensitivity of the image sensor may be deteriorated.

According to some embodiments of the inventive concepts, the grid pattern 123 is not vertically aligned with the first device isolation layer such that the oblique light L passing through the first color filter CF1 can be provided into the photoelectric conversion element PD of the first pixel PX1 sensing the same color as the first color filter CF1. For example, if the light L is obliquely incident from the left to the right, the grid pattern 123 may be moved from the first device isolation layer 103 to the left. Thus, the light L may be reflected by the grid pattern 123 and then incident on the corresponding photoelectric conversion element PD. In addition, an incident direction of the light L may be closer to the grid pattern 123 than the first device isolation layer 103. Thus, even though the light L is not reflected by the grid pattern 123, the light L may be blocked by the first device isolation layer 103 and may be then incident on the corresponding photoelectric conversion element PD. Thus, the crosstalk may be inhibited to improve the sensitivity of the image sensor.

Figure 5:
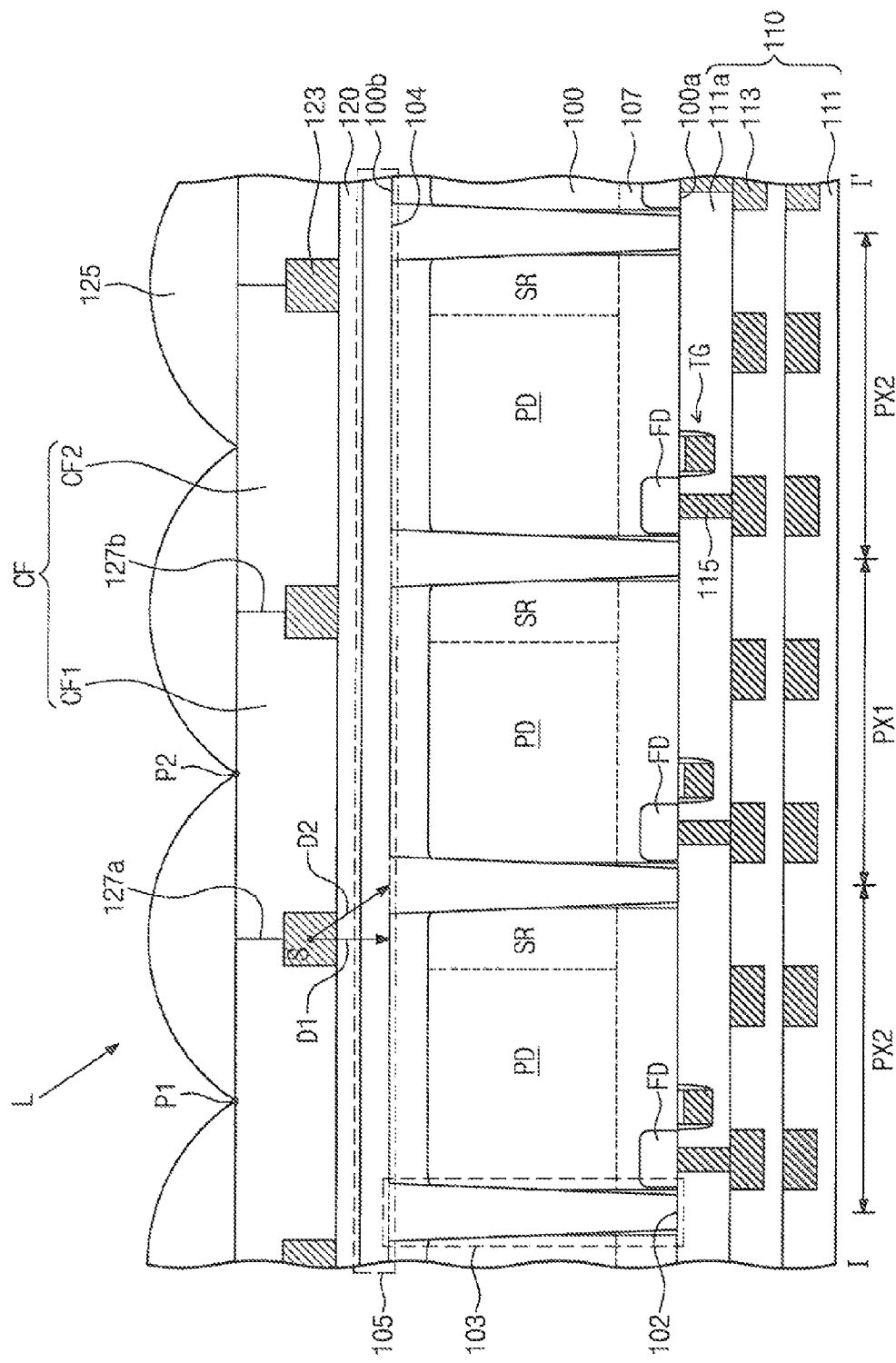
FIG. 5 is a cross-sectional view taken along a line I-I' of FIG. 1 to illustrate an image sensor according to some embodiments of the inventive concepts.

FIG. 5 is a cross-sectional view taken along a line I-I' of FIG. 1 to illustrate an image sensor according to some embodiments of the inventive concepts. In FIG. 5, the same elements as described in FIG. 3 will be indicated by the same reference numerals or the same reference designators. The descriptions to the same elements as in FIG. 3 will be omitted or mentioned briefly for the purpose of ease and convenience in explanation.

Referring to FIG. 5, a grid pattern 123 may be formed on the anti-reflection layer 120. The grid pattern 123 may be disposed on the second surface 100b of the substrate 100 of each of the pixels PX. The grid pattern 123 may not be vertically aligned with the first device isolation layer 103. The grid pattern 123 may vertically overlap with the partial region SR of the photoelectric conversion element PD. Thus, the shortest distance D1 between the center S of the grid pattern 123 and the second surface 100b of the substrate 100 may be smaller than the shortest distance D2 between the center S of the grid pattern 123 and the midpoint of the upper surface 104 of the first device isolation layer 103.

The color filters CF may be disposed on the anti-reflection layer 120. The color filters CF may include the first color filters CF1 and the second color filters CF2. Each of the color filters CF may be disposed between the grid patterns 123 adjacent to each other. In detail, the first color filters CF1 may be disposed on the photoelectric conversion elements PD of the first pixels PX1 in one-to-one correspondence. The second color filters CF2 may be disposed on the photoelectric conversion elements PD of the first pixels PX2 in one-to-one correspondence. In more detail, the first color filter CF1 may cover the photoelectric conversion element PD of the first pixel PX1 and the partial region SR of the photoelectric conversion element PD of the second pixel PX2 adjacent to the first pixel PX1 at the same time. The second color filter CF2 may cover the photoelectric conversion element PD of the second pixel PX2 and the partial region SR of the photoelectric conversion element PD of the first pixel PX1 adjacent to the second pixel PX2 at the same time.

Micro-lenses 125 may be disposed on the color filters CF. In the embodiments of FIG. 5, the micro-lenses 125 may not be vertically aligned with the color filters CF, respectively. For example, the first point P1 of the micro-lens 125 may be in contact with a top surface of the second color filter CF2, and the second point P2 of the micro-lens 125 may be in contact with a top surface of the first color filter CF1. In other words, the first and second points P1 and P2 may not be aligned with the sidewalls 127a and 127b of the color filters CF.

Figure 6:
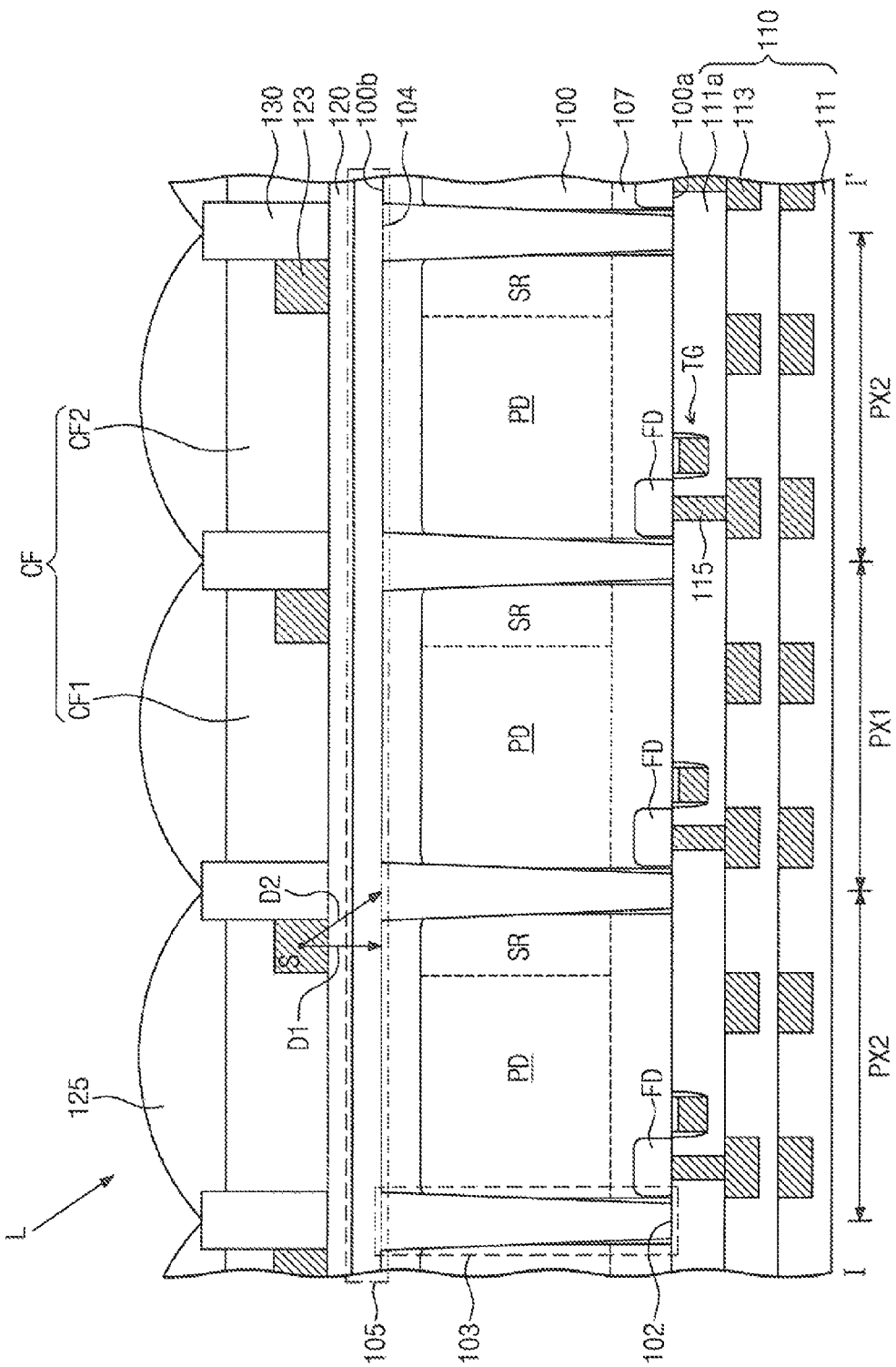
FIG. 6 is a cross-sectional view taken along a line I-I' of FIG. 1 to illustrate an image sensor according to some embodiments of the inventive concepts.

FIG. 6 is a cross-sectional view taken along a line I-I' of FIG. 1 to illustrate an image sensor according to some embodiments of the inventive concepts. In FIG. 6, the same elements as described in FIG. 3 will be indicated by the same reference numerals or the same reference designators. The descriptions to the same elements as in FIG. 3 will be omitted or mentioned briefly for the purpose of ease and convenience in explanation.

Referring to FIG. 6, an isolation member 130 may be disposed on the anti-reflection layer 120. The isolation member 130 may be disposed on the first device isolation layer 103. In some embodiments, the isolation member 130 may be vertically aligned with the first device isolation layer 103. The isolation member 130 may physically isolate the color filters CF respectively disposed in the pixels PX from each other. The isolation member 130 may include, for example, air.

The grid pattern 123 may be disposed on the anti-reflection layer 120. The grid pattern 123 may be disposed on the second surface 100b of the substrate 100 of each of the pixels PX. The grid pattern 123 may be disposed beside the isolation member 130, so that the grid pattern 123 may not be vertically aligned with the first device isolation layer 103. The grid pattern 123 may vertically overlap with the partial region SR of the photoelectric conversion element PD. Thus, the shortest distance D1 between the center S of the grid pattern 123 and the second surface 100b of the substrate 100 may be smaller than the shortest distance D2 between the center S of the grid pattern 123 and the midpoint of the upper surface 104 of the first device isolation layer 103.

The color filters CF may be disposed on the anti-reflection layer 120. Each of the color filters CF may cover the grid pattern 123 formed on respective ones of the pixels PX. The color filters CF may be disposed on the photoelectric conversion elements PD of the pixels PX in one-to-one correspondence. In detail, the first color filter CF1 may completely overlap with the photoelectric conversion element PD of the first pixel PX1. The first color filter CF1 may not overlap with the partial region SR of the photoelectric conversion element PD of the second pixel PX2. The second color filter CF2 may completely overlap with the photoelectric conversion element PD of the second pixel PX2. The second color filter CF2 may not overlap with the partial region SR of the photoelectric conversion element PD of the first pixel PX1.

Micro-lenses 125 may be disposed on the color filters CF. The micro-lenses 125 may be disposed on the color filters CF in one-to-one correspondence.

Figure 7:
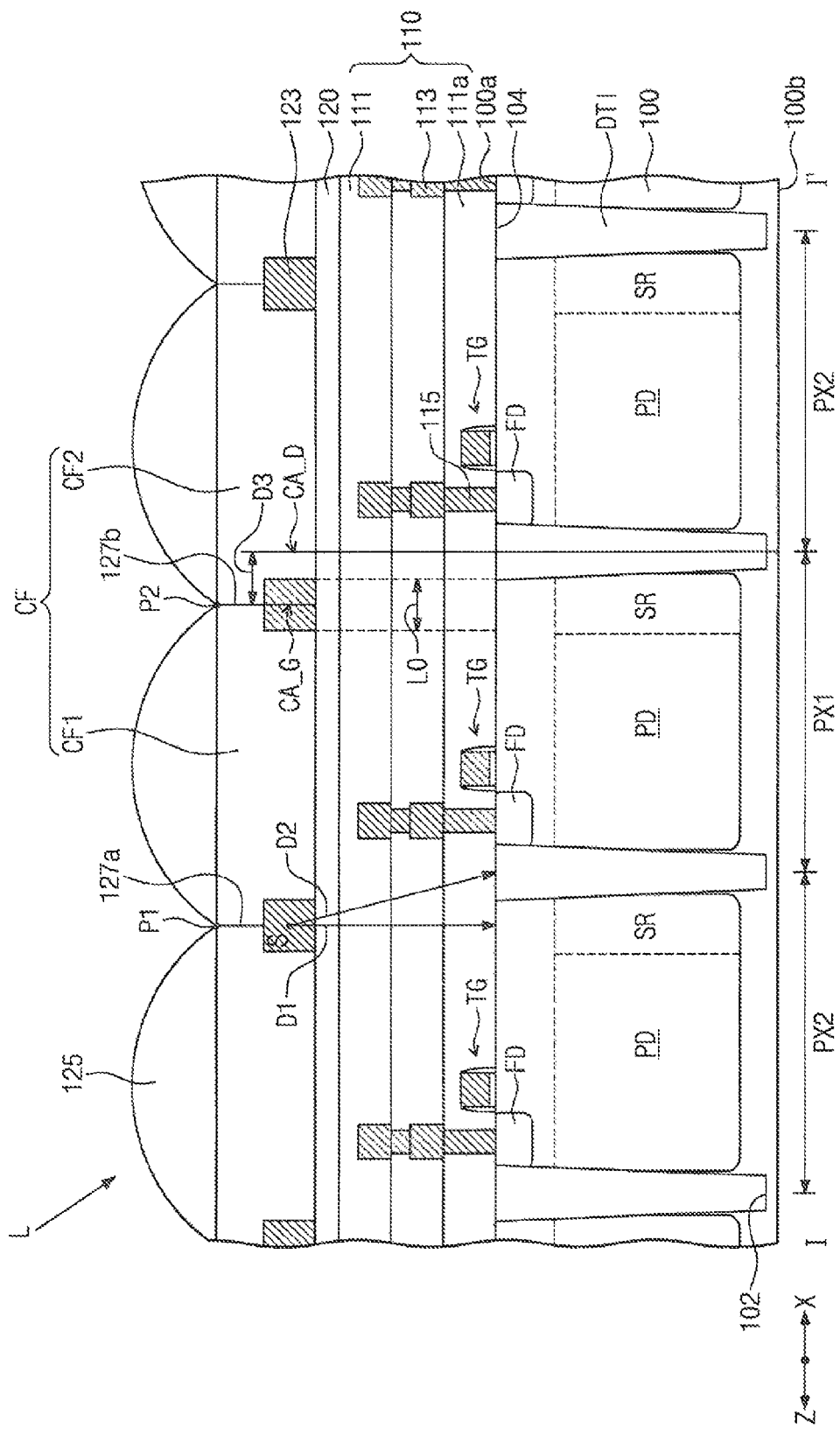
FIG. 7 is a cross-sectional view taken along a line I-I' of FIG. 1 to illustrate an image sensor according to some embodiments of the inventive concepts.

FIG. 7 is a cross-sectional view taken along a line I-I' of FIG. 1 to illustrate an image sensor according to some embodiments of the inventive concepts. In FIG. 7, the same elements as described in FIG. 3 will be indicated by the same reference numerals or the same reference designators. The descriptions to the same elements as in FIG. 3 will be omitted or mentioned briefly for the purpose of ease and convenience in explanation.

Referring to FIG. 7, a deep device isolation layer DTI may be formed in a substrate 100 to define pixels PX. The pixels PX may include first pixels PX1 and second pixels PX2. A lower surface 102 of the deep device isolation layer DTI may be disposed in the substrate 100. An upper surface 104 of the deep device isolation layer DTI may be disposed at the same level as the first surface 100a of the substrate 100. Thus, the upper surface 104 of the deep device isolation layer DTI may be exposed by the first surface 100a of the substrate 100. A photoelectric conversion element PD and a well region 107 may be disposed in the substrate 100 of each of the pixels PX. A floating diffusion region FD may be disposed in the well region 107 of each of the pixels PX.

A transfer gate TG may be disposed on the first surface 100a of the substrate 100. The transfer gate TG may be disposed in each of the pixels PX and may be adjacent to the floating diffusion region FD. An interconnection structure 110 may be disposed on the first surface 100a of the substrate 100. The interconnection structure 110 may include interlayer insulating layers 111 and interconnections 113. A first interlayer insulating layer 111a which is in contact with the first surface 100a of the substrate 100 may cover the transfer gate TG. A through-via 115 that penetrates the first interlayer insulating layer 111a may be in contact with the floating diffusion region FD of each of the pixels PX.

An anti-reflection layer 120 may be disposed on the interconnection structure 110. A grid pattern 123 may be disposed on the anti-reflection layer 120. In detail, the grid pattern 123 may be disposed on the first surface 100a of the substrate 100 of each of the pixels PX. The grid pattern 123 may not be vertically aligned the deep device isolation layer DTI. The grid pattern 123 may vertically overlap with a partial region SR of the photoelectric conversion element PD. The shortest distance D1 between a center S of the grid pattern 123 and the first surface 100a of the substrate 100 may be smaller than the shortest distance D2 between the center S of the grid pattern 123 and the midpoint of the upper surface 104 of the deep device isolation layer DTI.

In some embodiments, a central vertical axis CA_G of the grid pattern 123 may be offset in the third direction Z from a central vertical axis CA_D of the deep device isolation layer DTI by a distance D3 as illustrated in FIG. 7. The central vertical axis CA_G of the grid pattern 123 may pass through the center S of the grid pattern 123, and the central vertical axis CA_D of the deep device isolation layer DTI may pass through the midpoint of the upper surface 104 of the deep device isolation layer DTI. Further, the central vertical axis CA_G of the grid pattern 123 may be offset in the third direction Z from the central vertical axis CA_D of the deep device isolation layer DTI toward the photoelectric conversion element PD. Referring again to FIG. 2, the central vertical axis CA_G of the grid pattern 123 may be offset in the third direction Z from the central vertical axis CA_D of the deep device isolation layer DTI toward one of opposing short sides of the image sensor that is closer to the pixel PX1. The grid pattern 123 may vertically overlap the photoelectric conversion element PD by a length L0 as illustrated in FIG. 7.

Color filters CF may be disposed on the anti-reflection layer 120. The color filters CF may include first color filters CF1 and second color filters CF2. Each of the color filters CF may be disposed between the grid patterns 123 adjacent to each other. In detail, the first color filters CF1 may be disposed on the photoelectric conversion elements PD of the first pixels PX1 in one-to-one correspondence, and the second color filters CF2 may be disposed on the photoelectric conversion elements PD of the first pixels PX2 in one-to-one correspondence. In more detail, the first color filter CF1 may cover the photoelectric conversion element PD of the first pixel PX1 and the partial region SR of the photoelectric conversion element PD of the second pixel PX2 adjacent to the first pixel PX1 at the same time. The second color filter CF2 may cover the photoelectric conversion element PD of the second pixel PX2 and the partial region SR of the photoelectric conversion element PD of the first pixel PX1 adjacent to the second pixel PX2 at the same time.

Micro-lenses 125 may be disposed on the color filters CF. The micro-lenses 125 may be disposed on the color filters CF in one-to-one correspondence. In detail, the micro-lens 125 may include a first point P1 and a second point P2 at which top and bottom surfaces of the micro-lens 125 meet each other. The first point P1 may be collinear with one sidewall 127a of the color filter CF, and the second point P2 may be collinear with another sidewall 127b of the color filter CF.

Figure 8:
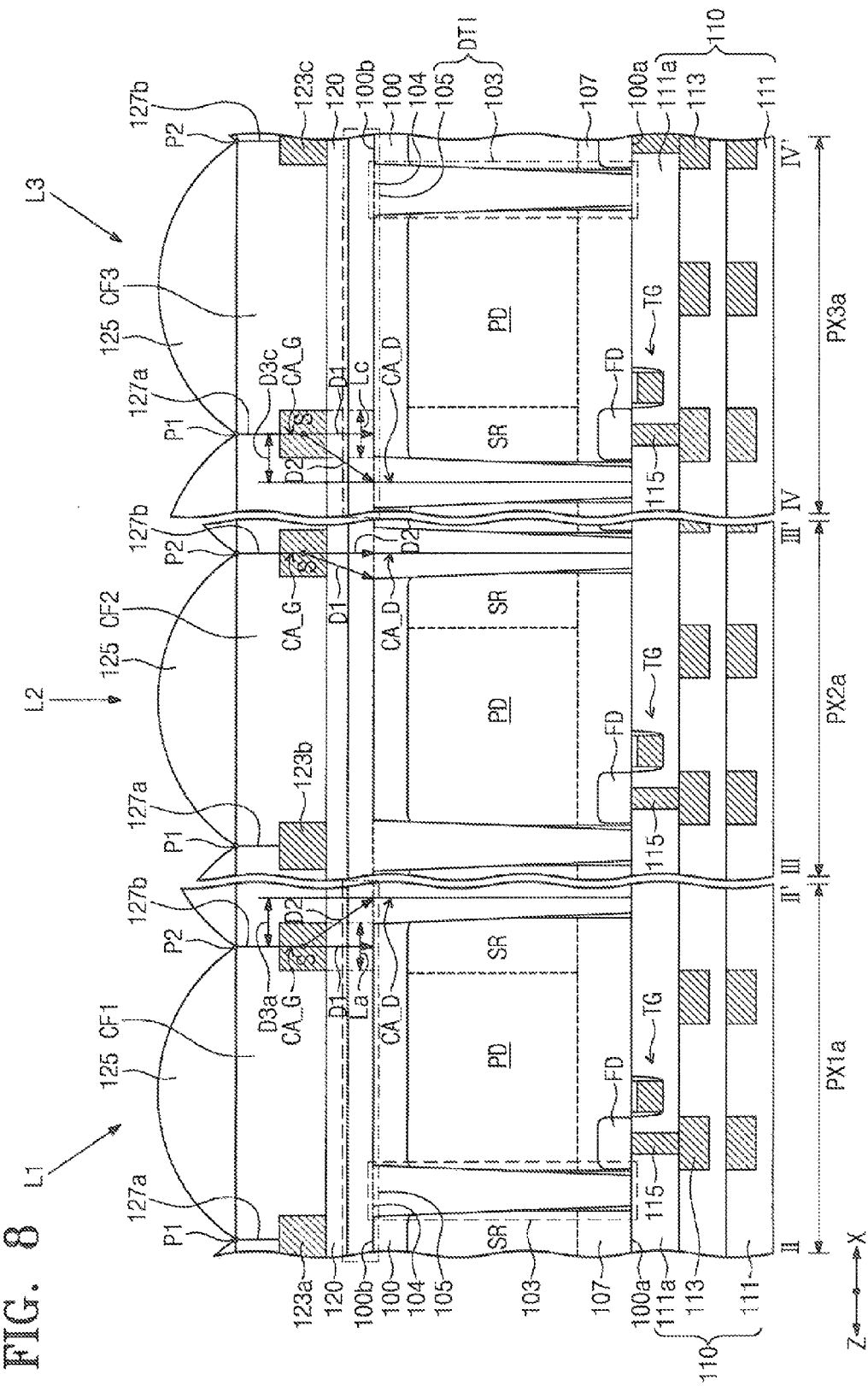
FIG. 8 illustrates cross-sectional views taken along lines II-II', III-III', and IV-IV' of FIG. 2 to illustrate an image sensor according to some embodiments of the inventive concepts.

FIG. 8 illustrates cross-sectional views taken along line II-II', III-III', and IV-IV' of FIG. 2 to illustrate an image sensor according to some embodiments of the inventive concepts. In FIG. 8, the same elements as described in FIG. 3 will be indicated by the same reference numerals or the same reference designators. The descriptions to the same elements as in FIG. 3 will be omitted or mentioned briefly for the purpose of ease and convenience in explanation.

Referring to FIGS. 2 and 8, a substrate 100 may include a plurality of pixels PX. The pixels PX may be arranged in a first direction X and a second direction Y perpendicular to the first direction X. The substrate 100 may include a central region CR, a first edge region PR1, and a second edge region PR2 when viewed from a plan view. The first edge region PR1 may surround a first side S1 a third side S3 of the central region CR when viewed from a plan view. The third side S3 may be adjacent to the first side S1. The second edge region PR2 may surround a second side S2 and a fourth side S4 of the central region CR when viewed from a plan view. The fourth side S4 may be adjacent to the second side S2. The first side S1 and the second side S2 of the central region CR may face each other in the first direction X, and the third side S3 and the fourth side S4 of the central region CR may face each other in the second direction Y. The first edge region PR1 may include a first pixel PX1a, the central region CR may include a second pixel PX2a, and the second edge region PR2 may include a third pixel PX3a. A center of the image sensor may be closer to the second pixel PX2a than to the first pixel PX1a and the third pixel PX3a, and the first pixel PX1a and the third pixel PX3a may be in opposite regions of the image sensor with respect to the center of the image sensor as illustrated in FIG. 2.

The first to third pixels PX1a, PX2a, and PX3a may be defined by a deep device isolation layer DTI which may be formed in the substrate 100 by a deep trench isolation technique.

A photoelectric conversion element PD and a well region 107 may be formed in the substrate 100 of each of the pixels. The photoelectric conversion element PD may be spaced apart from the first surface 100a of the substrate 100, and the well region 107 may be adjacent to the first surface 100a of the substrate. A floating diffusion region PD may be disposed in the well region 107. A transfer gate TG may be disposed on the first surface 100a of the substrate 100. The transfer gate TG may be disposed in each of the pixels PX and may be adjacent to the floating diffusion region FD.

An interconnection structure 110 may be disposed on the first surface 100a of the substrate 100. An anti-reflection layer 120 may be disposed on the second surface 100b of the substrate 100 to cover the negative fixed charge layer 105 of the deep device isolation layer DTI.

A grid pattern may be disposed on the anti-reflection layer 120 of each of the pixels X. A first grid pattern 123a disposed in the first pixel PX1a may not be vertically aligned with the first device isolation layer 103. In more detail, the first grid pattern 123a may vertically overlap with a partial region SR of the photoelectric conversion element PD of the first pixel PX1a. The partial region SR of the photoelectric conversion element PD may be adjacent to the first device isolation layer 103 and may be disposed far away from the floating diffusion region FD. As a result, the shortest distance D1 between a center S of the first grid pattern 123a and the second surface 100b of the substrate 100 may be smaller than the shortest distance D2 between the center S of the first grid pattern 123a and the midpoint of the upper surface 104 of the first device isolation layer 103.

According to FIG. 8, a central vertical axis CA_G of the first grid pattern 123a may be offset in the third direction Z from a central vertical axis CA_D of the first device isolation layer 103 by a distance D3a. The central vertical axis CA_G of the first grid pattern 123a may be offset in the third direction Z from the central vertical axis CA_D of the first device isolation layer 103 toward the photoelectric conversion element PD. Referring again to FIG. 2, the central vertical axis CA_G of the first grid pattern 123a may be offset in the third direction Z from the central vertical axis CA_D of the first device isolation layer 103 toward a first one of opposing short sides of the image sensor that is closer to the first pixel PX1a. The first grid pattern 123a may vertically overlap the photoelectric conversion element PD by a length La as illustrated in FIG. 8.

In contrast, a second grid pattern 123b disposed in the second pixel PX2a may vertically overlap, and in some cases be vertically aligned, with the upper surface 104 of the first device isolation layer 103. In other words, the second grid pattern 123b may be vertically aligned with the first device isolation layer 103 in some embodiments. Thus, the shortest distance D1 between a center S of the second grid pattern 123b and the second surface 100b of the substrate 100 may be greater than the shortest distance D2 between the center S of the second grid pattern 123b and the midpoint of the upper surface 104 of the first device isolation layer 103.

A central vertical axis CA_G of the second grid pattern 123b may not be offset from a central vertical axis CA_D of the first device isolation layer 103 as illustrated in FIG. 8. An offset between the central vertical axis CA_G of the second grid pattern 123b and the central vertical axis CA_D of the first device isolation layer 103 may be substantially zero. In some embodiments, the second grid pattern 123b may not vertically overlap the photoelectric conversion element PD as illustrated in FIG. 8, and an overlapping length between the second grid pattern 123b and the photoelectric conversion element PD may be substantially zero.

A third grid pattern 123c disposed in the third pixel PX3a may not be vertically aligned with the first device isolation layer 103. In more detail, the third grid pattern 123c may be vertically aligned with the floating diffusion region FD of the third pixel PX3a. As a result, the shortest distance D1 between a center S of the third grid pattern 123c and the second surface 100b of the substrate 100 may be smaller than the shortest distance D2 between the center S of the third grid pattern 123c and the upper surface 104 of the first device isolation layer 103.

A central vertical axis CA_G of the third grid pattern 123c may be offset in the first direction X from a central vertical axis CA_D of the first device isolation layer 103 by a distance D3c as illustrated in FIG. 8. The central vertical axis CA_G of the third grid pattern 123c may be offset in the first direction X from the central vertical axis CA_D of the first device isolation layer 103 toward the photoelectric conversion element PD. Referring again to FIG. 2, the central vertical axis CA_G of the third grid pattern 123c may be offset in the first direction X from the central vertical axis CA_D of the first device isolation layer 103 toward a second one of the opposing short sides of the image sensor that is closer to the third pixel PX3a. The third grid pattern 123c may vertically overlap the photoelectric conversion element PD by a length Lc as illustrated in FIG. 8.

The shortest distances D2 from the centers of the grid patterns to the midpoints of the upper surfaces 104 of the first device isolation layer 103 may be increased, in some embodiments may be gradually increased, from the pixels PX of the central region CR toward the pixels PX of the first edge region PR1. For example, the shortest distances D2 from the centers of the grid patterns to the midpoints of the upper surfaces 104 of the first device isolation layer 103 may be increased from the second pixel PX1a toward the first pixel PX2a. Thus, when viewed from a plan view, a distance by which the first grid pattern 123a is shifted from the upper surface 104 of the first device isolation layer 103 in the third direction Z opposite to the first direction X in the first pixel PX1a may be greater than a distance by which the second grid pattern 123b is shifted from the upper surface 104 of the first device isolation layer 103 in the third direction Z in the second pixel PX2a. In addition, the shortest distances D2 from the centers of the grid patterns to the midpoints of the upper surfaces 104 of the first device isolation layer 103 may be increased, in some embodiments may be gradually increased, from the pixels PX of the central region CR toward the pixels PX of the second edge region PR2. For example, the shortest distances D2 from the centers of the grid patterns to the midpoints of the upper surfaces 104 of the first device isolation layer 103 may be increased, in some embodiments may be gradually increased, from the second pixel PX2a toward the third pixel PX3a. Thus, when viewed from a plan view, a distance by which the third grid pattern 123c is shifted from the upper surface 104 of the first device isolation layer 103 in the first direction X in the third pixel PX3a may be greater than a distance by which the second grid pattern 123b is shifted from the upper surface 104 of the first device isolation layer 103 in the first direction X in the second pixel PX2a.

First light L1 incident on the first PX1a may be oblique to the second surface 100b of the substrate 100, second light L2 incident on the second pixel PX2a may be substantially perpendicular to the second surface 100b of the substrate 100, and third light L3 incident on the third pixel PX3a may be oblique to the second surface 100b of the substrate. Incident directions of the first and third lights L1 and L3 may be symmetrical. For example, the first light L1 may be obliquely incident from the left to the right, and the third light L3 may be obliquely incident from the right to the left.

Color filters CF may be disposed on the anti-reflection layer 120. Each of the color filters CF may be disposed between the grid patterns 123 adjacent to each other. A first color filter CF1 disposed in the first pixel PX1a may cover the photoelectric conversion element PD of the first pixel PX1a and a partial region SR of another photoelectric conversion element PD adjacent to the photoelectric conversion element PD of the first pixel PX1a at the same time. A second color filter CF2 disposed in the second pixel PX2a may completely cover the photoelectric conversion element PD of the second pixel PX2a. A third color filter CF3 disposed in the third pixel PX3a may cover the photoelectric conversion element PD of the third pixel PX3a and a partial region SR of another photoelectric conversion element PD adjacent to the photoelectric conversion element PD of the third pixel PX3a at the same time.

Micro-lenses 125 may be disposed on the color filters CF. The micro-lenses 125 may be disposed on the color filters CF in one-to-one correspondence. The micro-lens 125 may include a first point P1 and a second point P2 at which top and bottom surfaces of the micro-lens 125 meet each other. The first point P1 may be aligned with one sidewall 127a of the color filter CF, and the second point P2 may be aligned with another sidewall 127b of the color filter CF.

Figure 9:
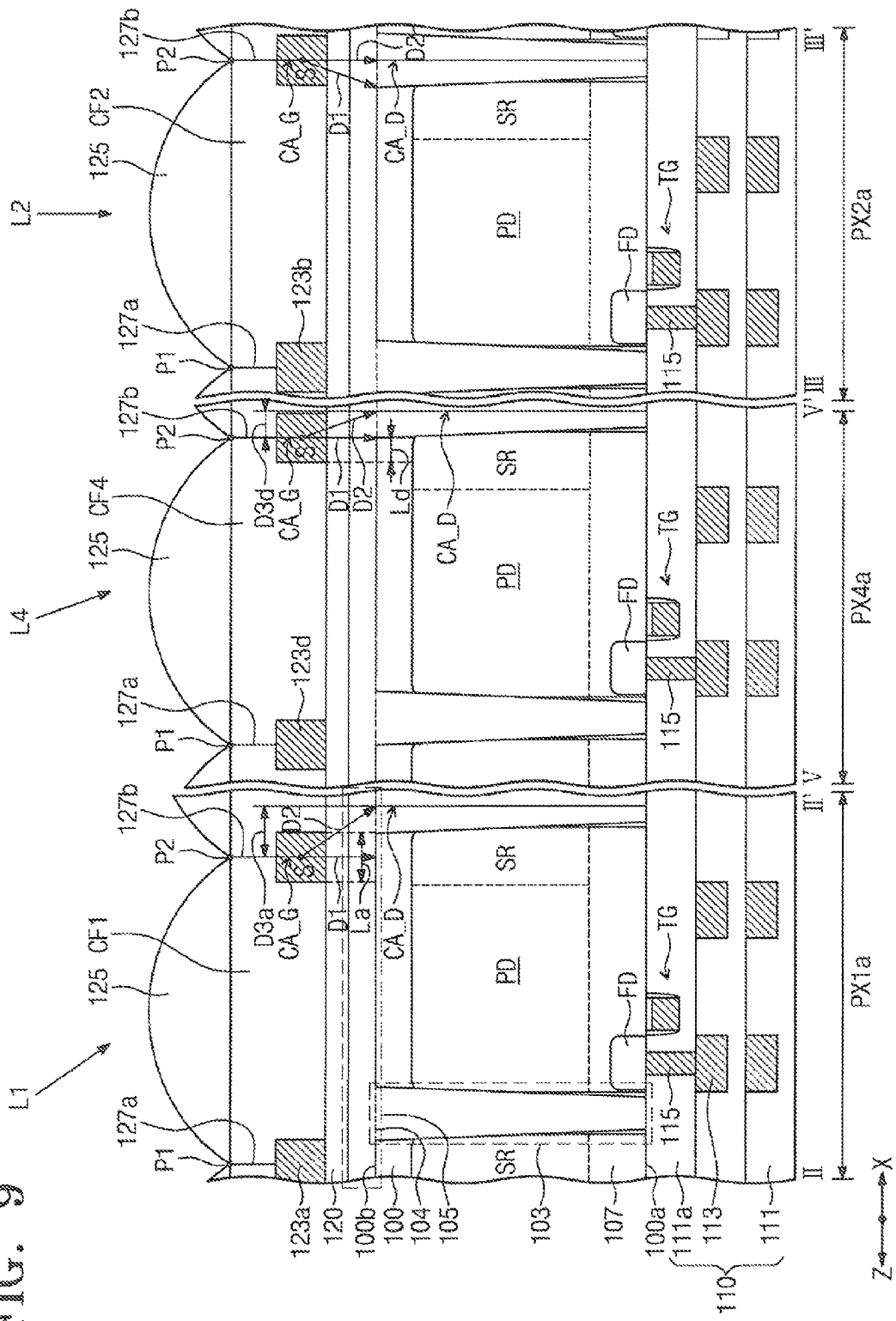
FIG. 9 illustrates cross-sectional views taken along lines II-II', V-V', and III-III' of FIG. 2 to illustrate an image sensor according to some embodiments of the inventive concepts.

FIG. 9 illustrates cross-sectional views taken along line II-II', V-V', and IV-IV' of FIG. 2 to illustrate an image sensor according to some embodiments of the inventive concepts. The cross-sectional views taken along the lines II-II' and IV-IV' are similar to those illustrated in FIG. 8. Referring to FIGS. 2 and 9, a fourth pixel PX4a may be in the first edge region PR1 in which the first pixel PX1a is. The center of the image sensor may be closer to the second pixel PX2a than to the fourth pixel PX4a, and the center of the image sensor may be closer to the fourth pixel PX4a than to the first pixel PX1a. The fourth pixel PX4a may be also defined by a deep device isolation layer DTI which may be formed in the substrate 100 by a deep trench isolation technique.

Referring to FIG. 9, a fourth grid pattern 123d disposed in the fourth pixel PX4a may not be vertically aligned with the first device isolation layer 103 and may vertically overlap with a partial region SR of the photoelectric conversion element PD of the fourth pixel PX4a. The shortest distance D1 between a center S of the fourth grid pattern 123d and the second surface 100b of the substrate 100 may be smaller than the shortest distance D2 between the center S of the fourth grid pattern 123d and the midpoint of the upper surface 104 of the first device isolation layer 103. The shortest distance D2 of the fourth pixel PX4a may be shorter than the shortest distance D2 of the first pixel PX1a and may be longer than the shortest distance D2 of the second pixel PX2a as illustrated in FIG. 9. Accordingly, it will be understood that, in some embodiments, the shortest distances D2 from the centers of the grid patterns to the midpoints of the upper surfaces 104 of the first device isolation layer 103 may be increased from the pixels PX of the central region CR toward the pixels PX of the first edge region PR1 or the second edge region PR2.

According to FIG. 9, a central vertical axis CA_G of the fourth grid pattern 123$d$ may be offset in the third direction Z from a central vertical axis CA_D of the first device isolation layer 103 by a distance D3$d$. The distance D3$d$ may be less than the distance D3$a$ of the first pixel PX1$a$. The central vertical axis CA_G of the fourth grid pattern 123$d$ may be offset in the third direction Z from the central vertical axis CA_D of the first device isolation layer 103 toward the photoelectric conversion element PD. The fourth grid pattern 123$d$ may vertically overlap the photoelectric conversion element PD by a length Ld, and the length Ld may be shorter than the length La of the first pixel PX1$a$. Therefore, it will be understood that, in some embodiments, an offset between a central vertical axis of a grid pattern of a pixel and a central vertical axis of a first device isolation layer 103 of the pixel may be increased from the center of the image sensor to the first edge region PR1 or the second edge region PR2. Further it will be understood that an overlapping length between a grid pattern of a pixel and a photoelectric conversion element PD of the pixel may be increased from the center of the image sensor to the first edge region PR1 or the second edge region PR2.

Figure 10:
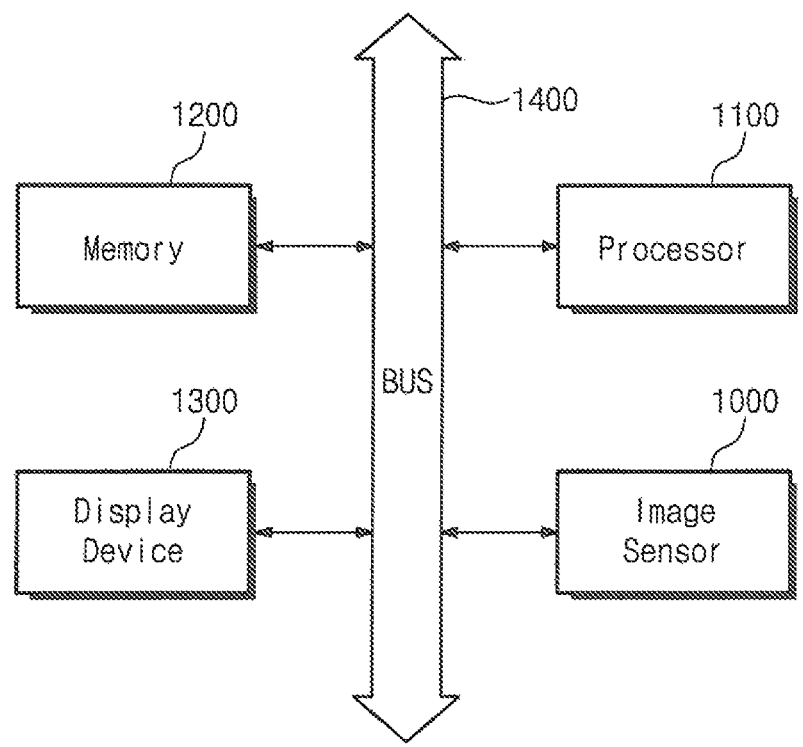
FIG. 10 is a schematic block diagram illustrating an electronic system including an image sensor according to some embodiments of the inventive concepts.
Figure 11:
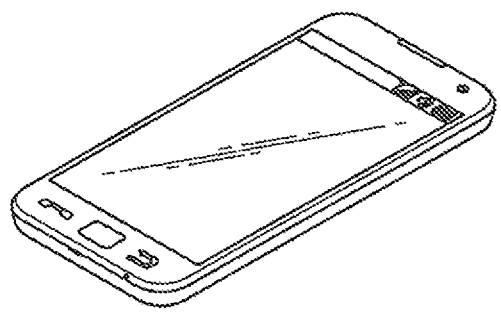
FIGS. 11 to 15 illustrate embodiments of multimedia devices implemented with image sensors according to some embodiments of the inventive concepts.
Figure 12:
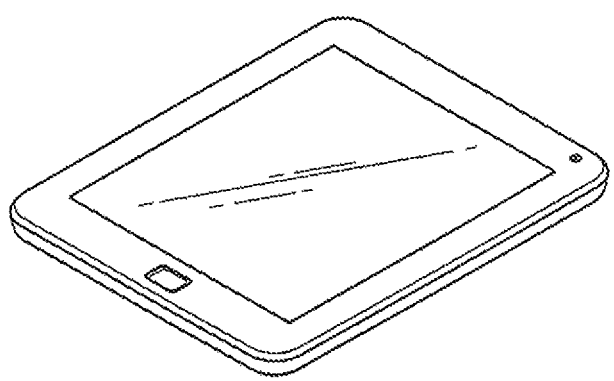
Figure 13:
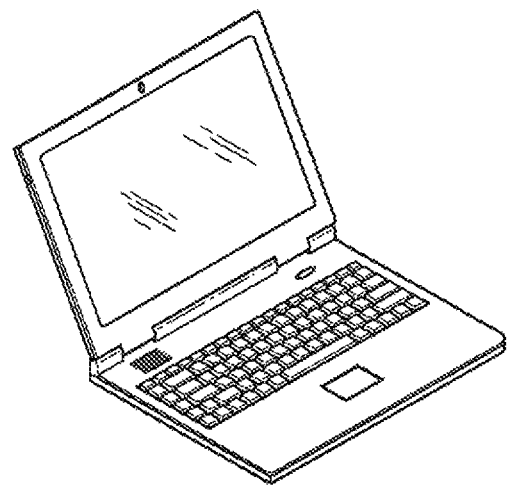
Figure 14:
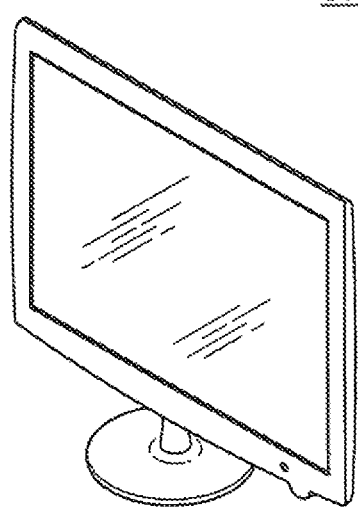
Figure 15:
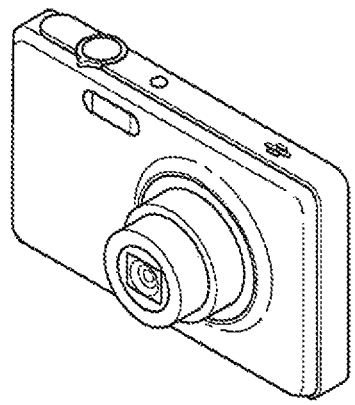

FIG. 10 is a schematic block diagram illustrating an electronic device including an image sensor according to some embodiments of the inventive concepts.

An electronic device may be a digital camera or a mobile device. Referring to FIG. 10, an electronic device may include an image sensor 1000, a processor 1100, a memory device 1200, a display device 1300, and a bus 1400. The image sensor 1000 may capture external image information in response to control signals of the processor 1100. The processor 1100 may store the captured image information into the memory device 1200 through the bus 1400. The processor 1100 may output the image information stored in the memory device 1200 to the display device 1300.

FIGS. 11 to 15 illustrate embodiments of multimedia devices implemented with image sensors according to some embodiments of the inventive concepts.

At least one of the image sensors according to the above embodiments of the inventive concepts may be applied to various multimedia devices having an image photographing function. For example, at least one of the image sensors according to the inventive concepts may be applied to a mobile or smart phone 2000 illustrated in FIG. 11 and/or a tablet or smart tablet 3000 illustrated in FIG. 12. In addition, at least one of the image sensors according to the inventive concepts may be applied to a notebook computer 4000 illustrated in FIG. 13 and/or a television or smart television 5000 illustrated in FIG. 14. Moreover, at least one of the image sensors according to the inventive concepts may be applied to a digital camera or digital camcorder 6000 illustrated in FIG. 15.

In the image sensor according to some embodiments of the inventive concepts, the grid pattern may not be vertically aligned with the deep device isolation layer, so the oblique light may not be incident on a neighboring pixel but may be incident on the corresponding pixel. As a result, the sensitivity of the image sensor may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
  a substrate including a first surface and a second surface opposite the first surface; and
  a first device isolation layer in the substrate and defining a plurality of pixels in the substrate;
  wherein each of the plurality of pixels comprises:
    a photoelectric conversion element;
    a floating diffusion region adjacent the first surface of the substrate;
    a grid pattern on the second surface of the substrate; and
    a color filter on the second surface of the substrate, the color filter corresponding to the photoelectric conversion element,
  wherein at least one grid pattern is laterally offset from the first device isolation layer, and
  wherein at least one color filter is laterally offset from a corresponding one of the pixels.

2. The image sensor of claim 1,
  wherein the first device isolation layer includes a lower surface proximate to the first surface of the substrate and an upper surface proximate to the second surface of the substrate, and
  wherein the lower surface of the first device isolation layer and the upper surface of the first device isolation layer are opposite to each other.

3. The image sensor of claim 1, wherein the laterally offset grid pattern vertically overlaps a partial region of the photoelectric conversion element that is adjacent to the first device isolation layer.

4. The image sensor of claim 1, further comprising:
  an interconnection structure on the first surface of the substrate; and
  a micro-lens disposed on the color filter.

5. The image sensor of claim 1,
  wherein the pixels include a first pixel and a second pixel, and
  wherein the color filter is disposed between the grid pattern of the first pixel and the grid pattern of the second pixel to cover the photoelectric conversion element of the first pixel and a partial region of the photoelectric conversion element of the second pixel.

6. The image sensor of claim 4, wherein the micro-lens includes a first point and a second point at which a top surface and a bottom surface of the micro-lens meet each other, and
  wherein the first point is aligned with one sidewall of the color filter and the second point is aligned with another sidewall of the color filter.

7. The image sensor of claim 4,
  wherein the pixels include a first pixel and a second pixel,
  wherein the micro-lens includes a first point and a second point at which a top surface and a bottom surface of the micro-lens meet each other, and
  wherein the first point is disposed on a top surface of the color filter disposed in the first pixel and the second point is disposed on a top surface of the color filter disposed in the second pixel.

8. The image sensor of claim 1, wherein the pixels include a first pixel and a second pixel, and
wherein the color filter covers a top surface of the grid pattern disposed in each of the pixels, the image sensor further comprising:
an isolation member between the color filter of the first pixel and the color filter of the second pixel.

9. The image sensor of claim 1, wherein a shortest distance between a center of the grid pattern and the second surface of the substrate is smaller than a shortest distance between the center of the grid pattern and a midpoint of the upper surface of the first device isolation layer.

10. The image sensor of claim 1, wherein the substrate comprises: a central region; a first edge region surrounding a first side of the central region and a third side of the central region adjacent to the first side; and a second edge region surrounding a second side of the central region and a fourth side of the central region adjacent to the second side,
wherein the pixels comprise: a first pixel disposed in the first edge region; a second pixel disposed in the central region; and a third pixel disposed in the second edge region,
wherein the grid pattern disposed in the first pixel is laterally offset from the first device isolation layer, and
wherein the color filter of the first pixel is laterally offset from the first pixel.

11. The image sensor of claim 10,
wherein the grid pattern disposed in the second pixel vertically overlaps with the first device isolation layer, and
wherein the color filter of the second pixel vertically overlaps the second pixel.

12. The image sensor of claim 11,
wherein the grid pattern disposed in the third pixel is laterally offset from the first device isolation layer, and
wherein the color filter of the third pixel is laterally offset from the third pixel.

13. The image sensor of claim 12, wherein the grid pattern disposed in the first pixel vertically overlaps a partial region of the photoelectric conversion element that is adjacent to the first device isolation layer,
wherein the partial region of the photoelectric conversion element of the first pixel is spaced away from the floating diffusion region of the first pixel, and
wherein the grid pattern in the third pixel vertically overlaps the floating diffusion region of the third pixel which is adjacent to the first device isolation layer.

14. The image sensor of claim 12, wherein shortest distances from centers of the grid patterns to midpoints of the upper surface of the first device isolation layers are gradually increased from the central region toward the first edge region and are gradually increased from the central region toward the second edge region.

15. The image sensor of claim 14, wherein a distance by which the grid pattern of the first pixel is shifted from the upper surface of the first device isolation layer of the first pixel in a first direction is greater than a distance by which the grid pattern of the second pixel is shifted from the upper surface of the first device isolation layer of the second pixel in the first direction,
wherein a distance by which the grid pattern of the third pixel is shifted from the upper surface of the first device isolation layer of the third pixel in a second direction opposite to the first direction is greater than a distance by which the grid pattern of the second pixel is shifted from the upper surface of the first device isolation layer of the second pixel in the second direction, and
wherein the first and second directions are parallel to the second surface of the substrate.

16. An image sensor comprising:
a substrate;
first and second pixels in the substrate;
a device isolation layer between the first and second pixels;
first and second color filters on the substrate above the first and second pixels, respectively; and
a grid pattern on the substrate between the first and second color filters;
wherein the grid pattern is laterally offset from the device isolation layer, and
wherein the first color filter is laterally offset from the first pixel.

17. The image sensor of claim 16, wherein the grid pattern does not vertically overlap the device isolation layer.

18. The image sensor of claim 16, wherein the grid pattern overlaps a partial region of a photoelectric conversion element in the first pixel.

19. An image sensor comprising:
a substrate;
a plurality of pixels in the substrate, each of the plurality of pixels comprising a photoelectric conversion element;
a plurality of device isolation layers between respective ones of the plurality of pixels;
a plurality of color filters on the substrate above respective ones of the plurality of pixels; and
a plurality of grid patterns on the substrate and disposed between respective ones of the color filters and exposing the photoelectric conversion elements of the plurality of pixels;
wherein the plurality of grid patterns are laterally offset from the plurality of device isolation layers, and
wherein the plurality of color filters are laterally offset from the respective ones of the plurality of pixels.

20. The image sensor of claim 19, wherein the plurality of grid patterns overlap partial regions of photoelectric conversion elements of the plurality of pixels.

* * * * *